US006859897B2

(12) United States Patent
Swoboda

(10) Patent No.: US 6,859,897 B2
(45) Date of Patent: Feb. 22, 2005

(54) RANGE BASED DETECTION OF MEMORY ACCESS

(75) Inventor: Gary L. Swoboda, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 627 days.

(21) Appl. No.: 09/798,596

(22) Filed: Mar. 2, 2001

(65) Prior Publication Data

US 2004/0073845 A1 Apr. 15, 2004

Related U.S. Application Data

(60) Provisional application No. 60/186,326, filed on Mar. 2, 2000, and provisional application No. 60/219,340, filed on Mar. 2, 2000.

(51) Int. Cl.⁷ .............................................. G06F 11/00
(52) U.S. Cl. ............................. 714/53; 714/5; 714/763
(58) Field of Search .............................. 714/5, 29, 42, 714/53, 719, 763

(56) References Cited

U.S. PATENT DOCUMENTS

| 4,414,665 | A | * | 11/1983 | Kimura et al. .............. 714/719 |
| 5,295,260 | A | * | 3/1994 | Pribnow ....................... 714/25 |
| 5,822,516 | A | * | 10/1998 | Krech, Jr. .................... 714/42 |
| 5,828,824 | A | | 10/1998 | Swoboda ...................... 714/25 |
| 6,065,090 | A | * | 5/2000 | Deas ............................. 711/1 |
| 6,154,862 | A | * | 11/2000 | Tabata et al. ............... 714/719 |
| 6,550,023 | B1 | * | 4/2003 | Brauch et al. ................ 714/42 |
| 6,584,594 | B1 | * | 6/2003 | Walters, Jr. ................. 714/763 |
| 2003/0135794 | A1 | * | 7/2003 | Longwell et al. ............. 714/42 |
| 2004/0153843 | A1 | * | 8/2004 | Kaiser et al. ................ 714/42 |

OTHER PUBLICATIONS

ARM Limited, RDI 1.5.1tx and RDI 1.5 1rt; Doc. No. RDI–0032–CUST–ESPC–A; May 19, 2000; pp. 1–55.
ARM Limited, ETM9, Rev. 1, Technical Reference Manual, Doc. No. DDI 0157C, pp. i–Index–3.
ARM Limited, Embedded Trace Macrocell, Rev. 1, Specification, Doc. No. IHI 0014E, pp. i–Index–3.

* cited by examiner

*Primary Examiner*—Robert Beausoliel
*Assistant Examiner*—Christopher S. McCarthy
(74) *Attorney, Agent, or Firm*—Robert D. Marshall, Jr.; W. James Brady, III; Frederick J. Telecky, Jr.

(57) ABSTRACT

Memory accesses in a data processing device (14) can be monitored by selecting, from among a plurality of available memory relationships (37, 82), a memory relationship relative to an address of a reference memory location (B2). When a memory access address bears the selected memory relationship relative to the address, an event (24) can be declared.

33 Claims, 4 Drawing Sheets

| COMPARISON CRITERIA B=BUS, R=REFERENCE | REFERENCE LSB Addr[1:0] | REFERENCE TYPE | | | BEQ[3:0] |
|---|---|---|---|---|---|
| B>R | 00 | BYTE | | | 1110 |
| B>R | 00 | | HW | | 1100 |
| B>R | 00 | | | FW | 0000 |
| B>R | 01 | BYTE | | | 1100 |
| B>R | 10 | BYTE | HW | | 1000 |
| B>R | 11 | BYTE | | | 0000 |
| B>=R | 00 | BYTE | HW | FW | 1111 |
| B>=R | 01 | BYTE | | | 1110 |
| B>=R | 10 | BYTE | HW | | 1100 |
| B>=R | 11 | BYTE | | | 1000 |
| B=R | 00 | BYTE | | | 0001 |
| B=R | 00 | | HW | | 0011 |
| B=R | 00 | | | FW | 1111 |
| B=R | 01 | BYTE | | | 0010 |
| B=R | 10 | BYTE | | | 0100 |
| B=R | 10 | | HW | | 1100 |
| B=R | 11 | BYTE | | | 1000 |
| B!=R | 00 | BYTE | | | 1110 |
| B!=R | 00 | | HW | | 1100 |
| B!=R | 00 | | | FW | 0000 |
| B!=R | 01 | BYTE | | | 1101 |
| B!=R | 10 | BYTE | | | 1011 |
| B!=R | 10 | | HW | | 0011 |
| B!=R | 11 | BYTE | | | 0111 |
| B<=R | 00 | BYTE | HW | FW | 0001 |
| B<=R | 01 | BYTE | | | 0011 |
| B<=R | 10 | BYTE | HW | | 0111 |
| B<=R | 11 | BYTE | | | 1111 |
| B<R | 00 | BYTE | HW | FW | 0000 |
| B<R | 01 | BYTE | | | 0001 |
| B<R | 10 | BYTE | HW | | 0011 |
| B<R | 11 | BYTE | | | 0111 |

*FIG. 8*

RANGE BASED DETECTION OF MEMORY ACCESS

This application claims the priority under 35 U.S.C. 119(e) (1) of the following co-pending U.S. provisional applications: 60/186,326 filed on Mar. 2, 2000; and 60/219,340 originally filed on Mar. 2, 2000 as non-provisional U.S. Ser. No. 09/515,093 and thereafter converted to provisional application status by a petition granted on Aug. 18, 2000.

FIELD OF THE INVENTION

The invention relates generally to electronic data processing and, more particularly, to emulation, simulation and test capabilities of electronic data processing devices and systems.

BACKGROUND OF THE INVENTION

Advanced wafer lithography and surface-mount packaging technology are integrating increasingly complex functions at both the silicon and printed circuit board level of electronic design. Diminished physical access is an unfortunate consequence of denser designs and shrinking interconnect pitch. Designed-in testability is needed, so that the finished product is still both controllable and observable during test and debug. Any manufacturing defect is preferably detectable during final test before a product is shipped. This basic necessity is difficult to achieve for complex designs without taking testability into account in the logic design phase, so that automatic test equipment can test the product.

In addition to testing for functionality and for manufacturing defects, application software development requires a similar level of simulation, observability and controllability in the system or sub-system design phase. The emulation phase of design should ensure that an IC (integrated circuit), or set of ICs, functions correctly in the end equipment or application when linked with the software programs.

With the increasing use of ICs in the automotive industry, telecommunications, defense systems, and life support systems, thorough testing and extensive realtime debug becomes a critical need.

Functional testing, wherein a designer is responsible for generating test vectors that are intended to ensure conformance to specification, still remains a widely used test methodology. For very large systems this method proves inadequate in providing a high level of detectable fault coverage. Automatically generated test patterns would be desirable for full testability, and controllability and observability are key goals that span the full hierarchy of test (from the system level to the transistor level).

Another problem in large designs is the long time and substantial expense involved. It would be desirable to have testability circuitry, system and methods that are consistent with a concept of design-for-reusability. In this way, subsequent devices and systems can have a low marginal design cost for testability, simulation and emulation by reusing the testability, simulation and emulation circuitry, systems and methods that are implemented in an initial device. Without a proactive testability, simulation and emulation approach, a large of subsequent design time is expended on test pattern creation and upgrading.

Even if a significant investment were made to design a module to be reusable and to fully create and grade its test patterns, subsequent use of the module may bury it in application specific logic, and make its access difficult or impossible. Consequently, it is desirable to avoid this pitfall.

The advances of IC design, for example, are accompanied by decreased internal visibility and control, reduced fault coverage and reduced ability to toggle states, more test development and verification problems, increased complexity of design simulation and continually increasing cost of CAD (computer aided design) tools. In board design the side effects include decreased register visibility and control, complicated debug and simulation in design verification, loss of conventional emulation due to loss of physical access by packaging many circuits in one package, increased routing complexity on the board, increased costs of design tools, mixed-mode packaging, and design for produceability. In application development, some side effects are decreased visibility of states, high speed emulation difficulties, scaled time simulation, increased debugging complexity, and increased costs of emulators. Production side effects involve decreased visibility and control, complications in test vectors and models, increased test complexity, mixed-mode packaging, continually increasing costs of automatic test equipment even into the 7-figure range, and tighter tolerances.

Emulation technology utilizing scan based emulation and multiprocessing debug was introduced over 10 years ago. In 1988, the change from conventional in circuit emulation to scan based emulation was motivated by design cycle time pressures and newly available space for on-chip emulation. Design cycle time pressure was created by three factors: higher integration levels—such as on-chip memory; increasing clock rates—caused electrical intrusiveness by emulation support logic; and more sophisticated packaging—created emulator connectivity issues.

Today these same factors, with new twists, are challenging a scan based emulator's ability to deliver the system debug facilities needed by today's complex, higher clock rate, highly integrated designs. The resulting systems are smaller, faster, and cheaper. They are higher performance with footprints that are increasingly dense. Each of these positive system trends adversely affects the observation of system activity, the key enabler for rapid system development. The effect is called "vanishing visibility".

Application developers prefer visibility and control of all relevant system activity. The steady progression of integration levels and increases in clock rates steadily decrease the visibility and control available over time. These forces create a visibility and control gap, the difference between the desired visibility and control level and the actual level available. Over time, this gap is sure to widen. Application development tool vendors are striving to minimize the gap growth rate. Development tools software and associated hardware components must do more with less and in different ways; tackling the ease of use challenge is amplified by these forces.

With today's highly integrated System-On-a-Chip (SOC) technology, the visibility and control gap has widened dramatically. Traditional debug options such as logic analyzers and partitioned prototype systems are unable to keep pace with the integration levels and ever increasing clock rates of today's systems.

As integration levels increase, system buses connecting numerous subsystem components move on chip, denying traditional logic analyzers access to these buses. With limited or no significant bus visibility, tools like logic analyzers cannot be used to view system activity or provide the trigger mechanisms needed to control the system under development. A loss of control accompanies this loss in visibility, as it is difficult to control things that are not accessible.

To combat this trend, system designers have worked to keep these buses exposed, building system components in way that enabled the construction of prototyping systems with exposed buses. This approach is also under siege from the ever-increasing march of system clock rates. As CPU clock rates increase, chip to chip interface speeds are not keeping pace. Developers find that a partitioned system's performance does not keep pace with its integrated counterpart, due to interface wait states added to compensate for lagging chip to chip communication rates. At some point, this performance degradation reaches intolerable levels and the partitioned prototype system is no longer a viable debug option. We have entered an era where production devices must serve as the platform for application development.

Increasing CPU clock rates are also accelerating the demise of other simple visibility mechanisms. Since the CPU clock rates can exceed maximum I/O state rates, visibility ports exporting information in native form can no longer keep up with the CPU. On-chip subsystems are also operated at clock rates that are slower than the CPU clock rate. This approach may be used to simplify system design and reduce power consumption. These developments mean simple visibility ports can no longer be counted on to deliver a clear view of CPU activity.

As visibility and control diminish, the development tools used to develop the application become less productive. The tools also appear harder to use due to the increasing tool complexity required to maintain visibility and control. The visibility, control, and ease of use issues created by systems-on-a-chip are poised to lengthen product development cycles.

Even as the integration trends present developers with a difficult debug environment, they also present hope that new approaches to debug problems will emerge. The increased densities and clock rates that create development cycle time pressures also create opportunities to solve them.

On-chip, debug facilities are more affordable than ever before. As high speed, high performance chips are increasingly dominated by very large memory structures, the system cost associated with the random logic accompanying the CPU and memory subsystems is dropping as a percentage of total system cost. The cost of a several thousand gates is at an all time low, and can in some cases be tucked into a corner of today's chip designs. Cost per pin in today's high density packages has also dropped, making it easier to allocate more pins for debug. The combination of affordable gates and pins enables the deployment of new, on-chip emulation facilities needed to address the challenges created by systems-on-a-chip.

When production devices also serve as the application debug platform, they must provide sufficient debug capabilities to support time to market objectives. Since the debugging requirements vary with different applications, it is highly desirable to be able to adjust the on-chip debug facilities to balance time to market and cost needs.

Since these on-chip capabilities affect the chip's recurring cost, the scalability of any solution is of primary importance. "Pay only for what you need" should be the guiding principle for on-chip tools deployment. In this new paradigm, the system architect may also specify the on-chip debug facilities along with the remainder of functionality, balancing chip cost constraints and the debug needs of the product development team.

The emulation technology of the present invention uses the debug upside opportunities noted above to provide developers with an arsenal of debug capability aimed at narrowing the control and visibility gap.

This emulation technology delivers solutions to the complex debug problems of today's highly integrated embedded real-time systems. This technology attacks the loss of visibility, control, and ease of use issues described in the preceding section while expanding the feature set of current emulators.

The on-chip debug component of the present invention provides a means for optimizing the cost and debug capabilities. The architecture allows for flexible combinations of emulation components or peripherals tailored to meet system cost and time to market constraints. The scalability aspect makes it feasible to include them in production devices with manageable cost and limited performance overhead.

BRIEF DESCRIPTION OF THE DRAWINGS

FIG. 8 illustrates in tabular format some exemplary programmations of the byte enable qualifier register of FIG. 6.

DETAILED DESCRIPTION

Figure 1:
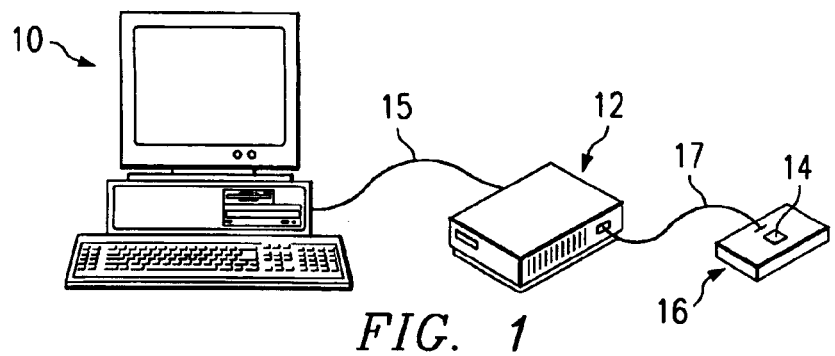
FIG. 1 diagrammatically illustrates exemplary embodiments of an emulation system according to the invention.

Emulation, debug, and simulation tools of the present invention are described herein. The emulation and debug solutions described herein are based on the premise that, over time, some if not most debug functions traditionally performed off chip must be integrated into the production device if they are to remain in the developer's debug arsenal. To support the migration of debug functions on chip, the present invention provides a powerful and scalable portfolio of debug capabilities for on-chip deployment. This technology preserves all the gains of initial JTAG technology while adding capabilities that directly assault the visibility, control, and ease of use issues created by the vanishing visibility trend.

Four significant architectural infrastructure components spearhead the assault on the control and visibility gap described earlier herein:

1. Real-time Emulation (RTE);

2. Real-time Data Exchange (RTDX™ a trademark of Texas Instruments Incorporated);

3. Trace; and

4. Advanced Analysis.

These components address visibility and control needs as shown in Table 1.

TABLE 1 1.1

Emulation System Architecture and Usage

| Architectural Component | Visibility Provisions | Control Provisions | Debug Usage |
|---|---|---|---|
| RTE | Static view of the CPU and memory state after background program is stopped. Interrupt driven code continues to execute. | Analysis components are used to stop execution of background program. | Basic debug Computational problems Code design problems |
| RTDX ™ | Debugger software interacts with the application code to exchange commands and data while the application continues to execute. | Analysis components are used to identify observation points and interrupt program flow to collect data. | Dynamic instrumentation Dynamic variable adjustments Dynamic data collection |
| Trace | Bus snooper hardware collects selective program flow and data transactions for export without interacting with the application, | Analysis components are used to define program segments and bus transactions that are to be recorded for export. | Prog. Flow corruption debug Memory corruption Benchmarking Code Coverage Path Coverage Program timing problems |
| Analysis | Allows observation of occurrences of events or event sequences. Measure elapsed time between events. Generate external triggers. | Alter program flow after the detection of events or event sequences. | Benchmarking Event/sequence identification Ext. trigger generation Stop program execution Activate Trace and RTDX ™ |

Real-Time Emulation (RTE) provides a base set of fixed capabilities for real-time execution control (run, step, halt, etc.) and register/memory visibility. This component allows the user to debug application code while real-time interrupts continue to be serviced. Registers and memory may be accessed in real-time with no impact to interrupt processing. Users may distinguish between real-time and non real-time interrupts, and mark code that must not be disturbed by real-time debug memory accesses. This base emulation capability includes hardware that can be configured as two single point hardware breakpoints, a single data watchpoint, an event counter, or a data logging mechanism. The EMU pin capability includes trigger I/Os for multiprocessor event processing and a uni-directional (target to host) data logging mechanism.

RTDX™ provides real-time data transfers between an emulator host and target application. This component offers both bi-directional and uni-directional DSP target/host data transfers facilitated by the emulator. The DSP (or target) application may collect target data to be transferred to the host or receive data from the host, while emulation hardware (within the DSP and the emulator) manages the actual transfer. Several RTDX™ transfer mechanisms are supported, each providing different levels of bandwidth and pin utilization allowing the trade off of gates and pin availability against bandwidth requirements.

Trace is a non-intrusive mechanism of providing visibility of the application activity. Trace is used to monitor CPU related activity such as program flow and memory accesses, system activity such as ASIC state machines, data streams and CPU collected data. Historical trace technology also used logic analyzer like collection and special emulation (SEs) devices with more pins than a production device. The logic analyzer or like device processed native representations of the data using a state machine like programming interface (filter mechanism). This trace model relied on all activity being exported with external triggering selecting the data that needed to be stored, viewed and analyzed.

Existing logic analyzer like technology does not, however, provide a solution to decreasing visibility due to higher integration levels, increasing clock rates and more sophisticated packaging. In this model, the production device must provide visibility through a limited number of pins. The data exported is encoded or compressed to reduce the export bandwidth required. The recording mechanism becomes a pure recording device, packing exported data into a deep trace memory. Trace software is used to convert the recorded data into a record of system activity.

On-chip Trace with high speed serial data export, in combination with Advanced Analysis provides a solution for SOC designs. Trace is used to monitor CPU related activity such as program flow and memory accesses, system activity such as ASIC state machines, data streams etc. and CPU collected data. This creates four different classes of trace data:

Program flow and timing provided by the DSP core (PC trace);
Memory data references made by the DSP core or chip level peripherals (Data reads and writes);
Application specific signals and data (ASIC activity); and CPU collected data.

Collection mechanisms for the four classes of trace data are modular allowing the trade off of functionality verses gates and pins required to meet desired bandwidth requirements.

The RTDX™ and trace functions provide similar, but different forms of visibility. They differ in terms of how data is collected, and the circumstances under which they would be most effective. A brief explanation is included below for clarity.

RTDX™ (Real Time Data exchange) is a CPU assisted solution for exchanging information; the data to be exchanged have a well-defined behavior in relation to the program flow. For example, RTDX™ can be used to record the input or output buffers from a DSP algorithm. RTDX™ requires CPU assistance in collecting data hence there is definite, but small, CPU bandwidth required to accomplish this. Thus, RTDX™ is an application intrusive mechanism of providing visibility with low recurring overhead cost.

Trace is a non-intrusive, hardware-assisted collection mechanism (such as, bus snoopers) with very high bandwidth (BW) data export. Trace is used when there is a need to export data at a very high data rate or when the behavior of the information to be traced is not known, or is random in nature or associated with an address. Program flow is a typical example where it is not possible to know the behavior a priori. The bandwidth required to export this class of information is high. Data trace of specified addresses is another example. The bandwidth required to export data trace is very high.

Trace data is unidirectional, going from target to host only. RTDX™ can exchange data in either direction although unidirectional forms of RTDX are supported (data logging). The Trace data path can also be used to provide very high speed uni-directional RTDX™ (CPU collected trace data).

The high level features of Trace and RTDX™ are outlined in Table 2.

TABLE 2 1.2

RTDX ™ and Trace Features

| Features | RTDX ™ | Trace |
|---|---|---|
| Bandwidth/pin | Low | High |
| Intrusiveness | Intrusive | Non-intrusive |
| Data Exchange | Bi-directional or uni-directional | Export only |
| Data collection | CPU assisted | CPU or Hardware assisted |
| Data transfer | No extra hardware for minimum BW (optional hardware for higher BW) | Hardware assisted |
| Cost | Relatively low recurring cost | Relatively high recurring cost |

Advanced analysis provides a non-intrusive on-chip event detection and trigger generation mechanism. The trigger outputs created by advanced analysis control other infrastructure components such as Trace and RTDX™. Historical trace technology used bus activity exported to a logic analyzer to generate triggers that controlled trace within the logic analyzer unit or generated triggers which were supplied to the device to halt execution. This usually involved a chip that had more pins than the production device (an SE or special emulation device). This analysis model does not work well in the System-on-a-Chip (SOC) era as the integration levels and clock rates of today's devices preclude full visibility bus export.

Advanced analysis provides affordable on-chip instruction and data bus comparators, sequencers and state machines, and event counters to recreate the most important portions of the triggering function historically found off chip. Advanced analysis provides the control aspect of debug triggering mechanism for Trace, RTDX™ and Real-Time Emulation. This architectural component identifies events, tracks event sequences, and assigns actions based on their occurrence (break execution, enable/disable trace, count, enable/disable RTDX™, etc.). The modular building blocks for this capability include bus comparators, external event generators, state machines or state sequencers, and trigger generators. The modularity of the advanced analysis system allows the trade off of functionality versus gates.

Emulator capability is created by the interaction of four emulator components:
1. debugger application program;
2. host computer;
3. emulation controller; and
4. on-chip debug facilities.

These components are connected as shown in FIG. 1. The host computer 10 is connected to an emulation controller 12 (external to the host) with the emulation controller (also referred to herein as the emulator or the controller) also connected to the target system 16. The user preferably controls the target application through a debugger application program, running on the host computer, for example, Texas Instruments' Code Composer Studio program.

A typical debug system is shown in FIG. 1. This system uses a host computer 10 (generally a PC) to access the debug capabilities through an emulator 12. The debugger application program presents the debug capabilities in a user-friendly form via the host computer. The debug resources are allocated by debug software on an as needed basis, relieving the user of this burden. Source level debug utilizes the debug resources, hiding their complexity from the user. The debugger together with the on-chip Trace and triggering facilities provide a means to select, record, and display chip activity of interest. Trace displays are automatically correlated to the source code that generated the trace log. The emulator provides both the debug control and trace recording function.

The debug facilities are programmed using standard emulator debug accesses through the target chips' JTAG or similar serial debug interface. Since pins are at a premium, the technology provides for the sharing of the debug pin pool by trace, trigger, and other debug functions with a small increment in silicon cost. Fixed pin formats are also supported. When the sharing of pins option is deployed, the debug pin utilization is determined at the beginning of each debug session (before the chip is directed to run the application program), maximizing the trace export bandwidth. Trace bandwidth is maximized by allocating the maximum number of pins to trace.

The debug capability and building blocks within a system may vary. The emulator software therefore establishes the configuration at run-time. This approach requires the hardware blocks to meet a set of constraints dealing with configuration and register organization. Other components provide a hardware search capability designed to locate the blocks and other peripherals in the system memory map. The emulator software uses a search facility to locate the resources. The address where the modules are located and a type ID uniquely identifies each block found. Once the IDs are found, a design database may be used to ascertain the exact configuration and all system inputs and outputs.

The host computer is generally a PC with at least 64 Mbytes of memory and capable of running at least Windows95, SR-2, Windows NT, or later versions of Windows. The PC must support one of the communications interfaces required by the emulator, for example:
Ethernet 10T and 100T, TCP/IP protocol;
Universal Serial Bus (USB), rev 1.x;

Firewire, IEEE 1394; and/or
Parallel Port (SPP, EPP, and ECP).

The emulation controller 12 provides a bridge between the host computer 10 and target system 16, handling all debug information passed between the debugger application running on the host computer and a target application executing on a DSP (or other target processor) 14.

One exemplary emulator configuration supports all of the following capabilities:
Real-time Emulation;
RTDX™;
Trace; and
Advanced Analysis.

Additionally, the emulator-to-target interface supports:
Input and output triggers;
Bit I/O; and
Managing special extended operating modes.

The emulation controller 12 accesses Real-time Emulation capabilities (execution control, memory, and register access) via a 3, 4, or 5 bit scan based interface. RTDX™ capabilities can be accessed by scan or by using three higher bandwidth RTDX™ formats that use direct target-to-emulator connections other than scan. The input and output triggers allow other system components to signal the chip with debug events and vice-versa.

The emulator 12 is partitioned into communication and emulation sections. The communication section supports communication with the host 10 on host communication links while the emulation section interfaces to the target, managing target debug functions and the device debug port. The emulator 12 communicates with the host computer 10 using e.g., one of the aforementioned industry standards communication links at 15. The host-to-emulator connection can be established with off the shelf cabling technology. Host-to-emulator separation is governed by the standards applied to the interface used.

The emulation controller 12 communicates with the target system 16 through a target cable or cables at. Debug, Trace, Triggers, and RTDX™ capabilities share the target cable, and in some cases, the same device pins. More than one target cable may be required when the target system deploys a trace width that cannot be accommodated in a single pin.

Figure 2:
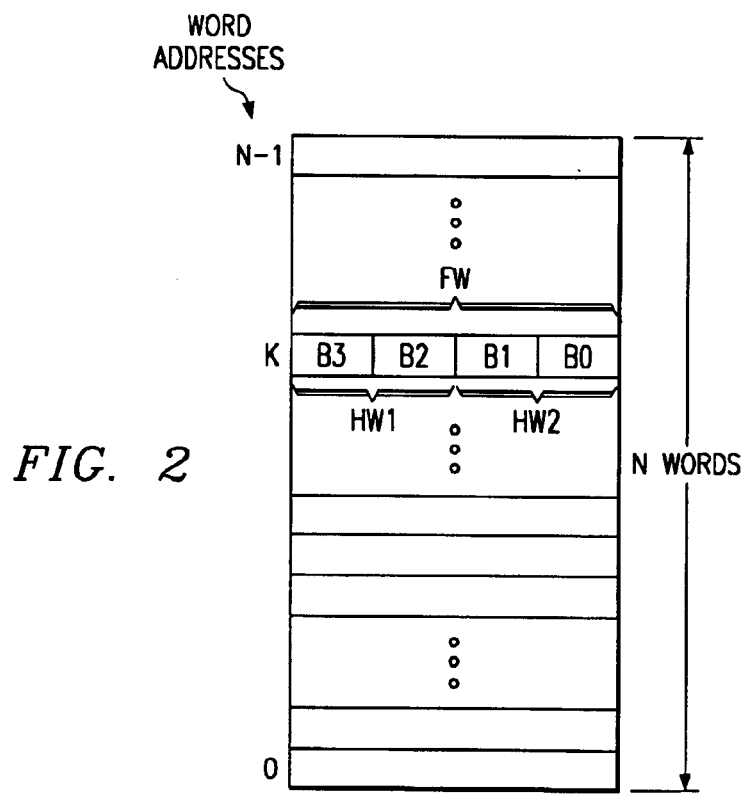
FIG. 2 illustrates an exemplary memory organization to which the present invention is applicable.

FIG. 2 illustrates an exemplary memory organization to which the present invention is applicable. The exemplary memory organization of FIG. 2 could be utilized, for example, in the target device 14 of FIG. 1. According to the invention, memory accesses within predetermined ranges of the memory illustrated in FIG. 2 can advantageously be detected as emulation events.

The exemplary memory of FIG. 2 includes N 32-bit words at word addresses 0 through (N-1). A 32-bit word in FIG. 2 is also referred to herein as a full word (FW). Each full word includes four 8-bit bytes (B0, B1, B2 and B3) and two 16-bit half words (HW1, HW2), each half word including two bytes. As shown in FIG. 2, the full words are respectively addressed by word addresses 0 through (N-1). For example, addresses 0 through (N-1) can utilize the most significant thirty bits of a 32-bit address bus, with the least significant two bits providing byte address capability, as is conventional.

The present invention provides capability to detect, for example, how a given memory access is related to a predetermined reference portion of the memory of FIG. 2. Thus, the relationship of a given memory access to, for example, byte 2 of word K can be determined, as can the relationship of a given memory access to, for example half word HW1 of word K, or to word K itself.

Figure 3:
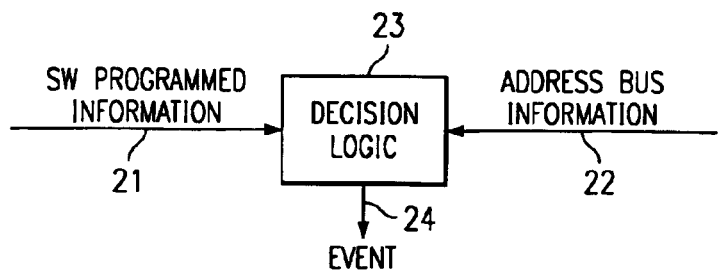
FIG. 3 diagrammatically illustrates exemplary embodiments of the present invention.

FIG. 3 illustrates exemplary embodiments of an apparatus according to the invention which can detect a predetermined relationship of a memory access to a selected portion of a memory (also referred to herein as the memory reference). The apparatus of FIG. 3 includes decision logic 23, which receives memory address bus information 22, and information 21 (software (SW)—programmed by the user) indicative of certain memory accesses which have a predetermined relationship relative to the memory reference. The logic 23 is operable for declaring such accesses as emulation events at 24.

Figure 4:
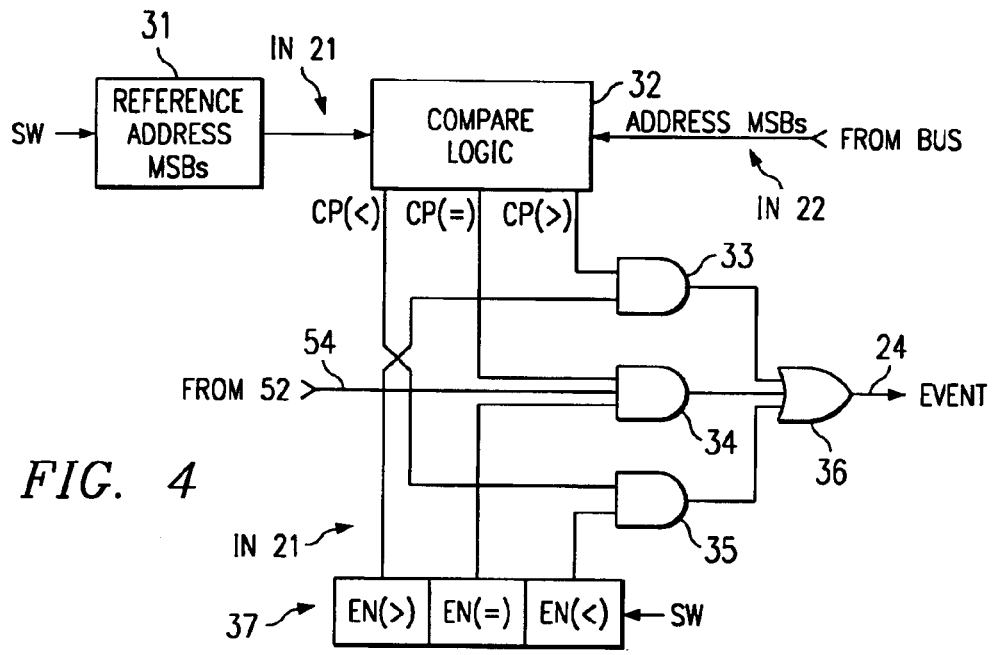
FIG. 4 diagrammatically illustrates pertinent portions of exemplary embodiments of the decision logic of FIG. 3.

FIG. 4 diagrammatically illustrates pertinent portions of exemplary embodiments of the decision logic of FIG. 3. In FIG. 4, compare logic 32 compares the most significant bits of the memory address bus (for example the most significant thirty bits of a 32-bit address bus) to corresponding reference address bits that are software programmed into a register 31. Using the example of a 32-bit address bus, the comparator 32 compares the thirty most significant bits from the address bus at 22 with thirty bits that have been programmed into the register 31. That is, the compare logic 32 compares the 30-bit word address from the address bus with a predetermined 30-bit word address in register 31. The compare logic 32 has the following three outputs: CP(<) which indicates that the address bus value is less than the reference address value; CP(=) which means that the address bus value is equal to the reference address value; and CP(>) which means that the address bus value is greater than the reference address value.

These three outputs are input to respective AND gates 33, 34 and 35, which AND gates also receive respective enable inputs EN(>), EN(=), and EN(<) from a software programmable register 37. Thus, if the bit EN(>) is set in register 37, an event will be declared by OR gate 36 whenever CP(>) is a logic 1, indicating that the address bus value is greater than the reference address value. Similarly, when EN(<) is set in register 37, an event will be declared when CP(<) is active, indicating that the address bus value is less than the reference address value. Using the 32-bit address/30-bit word address example, gate 33 indicates when the word address from the address bus is greater than the reference word address in register 31, and gate 35 indicates when the word address from the address bus is less than the reference address value in register 31. Thus, for example, if the reference address value in register 31 points to word K from FIG. 2, gate 33 will indicate when the word address on the address bus is in the range of word K+1 through word (N-1), and gate 35 will indicate when the word address on the address bus is in the range of word 0 through word K-1.

Regarding bit EN(=) of register 37, when this bit is active and the output CP(=) from compare logic 32 is also active, these two active signals qualify a further signal 54 at the input of AND gate 34. Activation of signal CP(=) indicates that the word address on the address bus is equal to the word address in the register 31 and, if the bit EN(=) is also set in register 37, then the signal 54 is qualified at gate 34.

Note also that register 37 can be programmed with any desired combination of the three enable bits.

Figure 5:
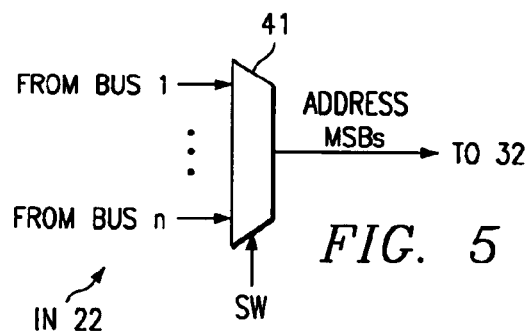
FIG. 5 diagrammatically illustrates pertinent portions of further exemplary embodiments of the decision logic of FIG. 3.

FIG. 5 illustrates pertinent portions of further exemplary embodiments of the decision logic of FIG. 2, wherein any of a plurality of buses at 22, for example Bus 1 through Bus n, can be multiplexed at 41, under software control, onto the input of compare logic 32. Therefore, the user, through software control, can monitor the address activity of any selected one of a plurality of buses. Moreover, the buses illustrated at Bus 1–Bus n can come from a single data processing core within the target device 14, or from a plurality of different data processing cores within the target device 14.

Figure 6:
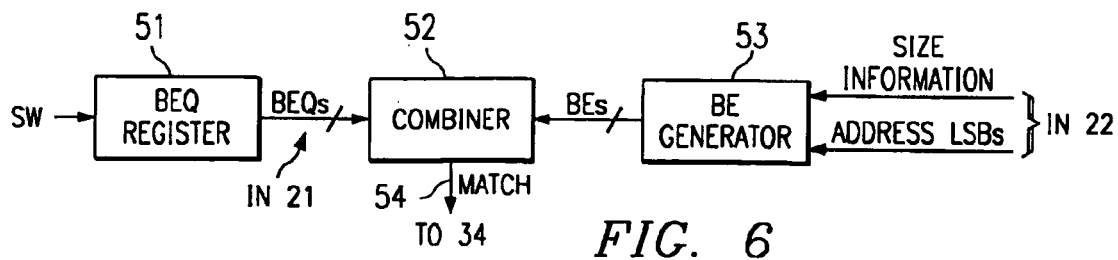
FIG. 6 diagrammatically illustrates exemplary embodiments of further pertinent portions of the decision logic of FIG. 3.

FIG. 6 diagrammatically illustrates further pertinent portions of exemplary embodiments of decision logic of FIG. 3. In particular, the arrangement of FIG. 6 is provided to produce the signal 54 described above with respect to FIG. 4. In FIG. 6, the least significant bits of the address on the address bus, for example the least significant two bits of the aforementioned 32-bit address, are applied to a byte-enable (BE) generator 53 together with bus information indicating the size of the memory access. Taking the memory organization of FIG. 2 as an example, the size information can indicate a byte access, a half word access, or a full word access. The byte enable generator 53 operates in conventional fashion to produce byte enable bits, a total of four bits in the example of FIG. 2, one bit for each byte in a given word. The byte enable bits basically designate, for example, which of the four bytes of the addressed word, e.g. word K, are being addressed. All four byte enable bits BE0–BE3 (see also FIG. 7) would be active if the entire word K is being addressed (a full word access). BE3 and BE2 alone would be active if the upper half word (HW1) is being addressed, BE0 and BE1 alone would be active if the lower half word (HW2) is being addressed, BE0 would be active alone if byte B0 of word K is being addressed, BE1 would be active alone if byte B1 of word K is being addressed, BE2 would be active alone if byte B2 of word K is being addressed, and BE3 would be active alone if byte B3 of word K is being addressed.

Figure 7:
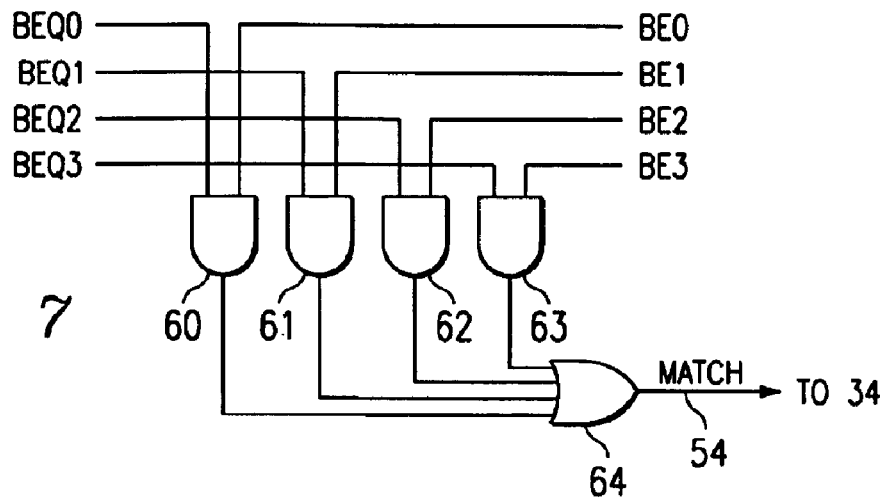
FIG. 7 diagrammatically illustrates an exemplary embodiment of the combiner of FIG. 6.

A byte enable qualifier (BEQ) register 51 is software-programmable with byte enable qualifier bits BEQ0, BEQ1, BEQ2 and BEQ3 (see also FIG. 7). These byte enable qualifier bits BEQ0–BEQ3 are combined with the byte enable bits BE0–BE3 by a combiner 52 to produce a match signal 54 which in turn drives gate 34 of FIG. 4.

FIG. 7 illustrates an exemplary embodiment of the combiner 52 of FIG. 6. As shown in FIG. 7, the byte enable qualifier bits BEQ0–BEQ3 are respectively ANDed with the byte enable bits BE0–BE3 at AND gates 60–63. The outputs of gates 60–63 are then applied to an OR gate 64 which drives the match signal 54. Thus, the byte enable qualifiers BEQ0–BEQ3 can be selected as desired to qualify any desired byte enable bits BE0–BE3 to activate the match signal 54, and to thereby drive the event signal 24 whenever CP(=) and EN(=) are active in FIG. 4. Thus, when the word address on the address bus is equal to the reference word address in FIG. 3, the byte enable qualifiers BEQ0–BEQ3 determine whether or not an event will be declared at 24 in FIG. 4.

FIG. 8 illustrates exemplary values with which the BEQ register of FIG. 6 can be programmed. The table of FIG. 8 includes a comparison criteria column which shows the desired relationship between the bus address (B in FIG. 8) and the reference address (R in FIG. 8), a reference LSB column which designates the two least significant bits of the reference address, and three reference type columns. The reference type refers to the size of the memory reference itself. Thus, any combination of reference LSBs can correspond to a byte memory reference type, the LSB combinations 00 and 10 can correspond to half word memory reference types, and the LSB combination 00 can also correspond to a full word memory reference type.

For example, for a byte memory reference type and a reference address whose LSBs are 00, the byte that is addressed would be byte B0 of the particular word, such that BE0=1 and BE1=BE2=BE3=0. Furthermore, if the comparison criterion is that the bus address B is greater than the reference address R, that is B>R, there are three possibilities for this criterion, namely: BE1=1, BE2=1, or BE3=1. This criterion can be satisfied by a byte access of byte B1, byte B2 or byte B3 (see also FIG. 2), or by a half word access of half word HW1. As shown in the BEQ column of row 80 in FIG. 8, in order to determine whether any of BE1, BE2, or BE3 is logic 1, the BEQ bits are programmed as BEQ3=BEQ2=BEQ1=1, and BEQ0=0.

As another example, with the same criterion B>R, and with reference LSBs of 00, but with the reference type as a half word, that half word will be the lower half word HW2 (see FIG. 2). Thus, if the bus address points to an address greater than that occupied by HW2, then one or both of BE2 and BE3 will be a logic 1 (byte access of B2 or B3, or half word access of HW1). Accordingly, the BEQ register is programmed in row 81 with BEQ3=BEQ2=1 and BEQ1=BEQ0=0.

Taking the same comparison criterion and the same reference address LSBs as above, but with a full word reference type, the bus address (which the compare logic 32 has already determined addresses the same word as the reference address) cannot possibly point to a portion of memory higher than the full word memory reference, so BEQ is programmed in row 82 with all zeroes to ensure that the match signal 54 is not activated. As a contrast, with reference address LSBs of 00 and a comparison criterion of B=R, and with a full word reference type, the only way that the B=R comparison criterion can be met is if BE0=BE1=BE2=BE3=1, so the BEQ register is programmed in row 83 with all ones.

Figure 9:
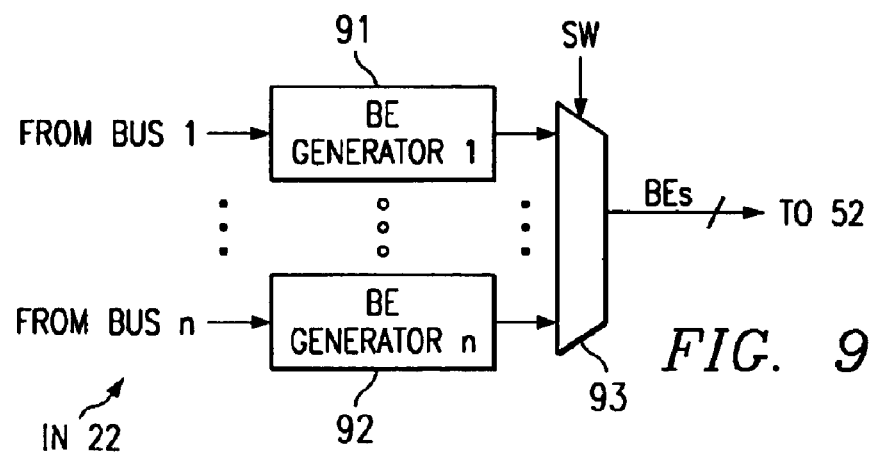
FIG. 9 diagrammatically illustrates pertinent portions of further exemplary embodiments of the decision logic of FIG. 3.

FIG. 9 illustrates pertinent portions of further exemplary embodiments of the decision logic of FIG. 3. In particular, FIG. 9 indicates that the byte enable inputs BE0–BE3 to the combiner 52 in FIG. 6 can be provided from any selected one of the aforementioned buses Bus 1–Bus n via a selector 93 that is software controlled. Each bus can be applied to a corresponding byte enable generator (see 91 and 92) designed to produce the corresponding byte enables in conventional fashion. Each of the buses Bus 1–Bus n may need its own byte enable generator because the signals of each bus may be arranged/formatted differently from those of the other buses.

It should be evident from the foregoing description that exemplary embodiments of the present invention permit a system developer to determine, for example during emulation/debug operations, how a memory address on the address bus (and thus the corresponding memory access) relates to the location of a particular memory reference. For example, the user can determine whether the memory access addresses a word whose word address is greater than, greater than or equal to, equal to, less than or equal to, or less than the word address of the memory reference. Moreover, if it is determined that the memory access addresses a word whose word address is equal to the word address of the memory reference, the invention can determine, within that word, whether the memory access addresses a portion of that word whose address is greater than, greater than or equal to, equal to, less than or equal to, or less than the address of the memory reference. These determinations can be made for any desired size of memory reference, for example, byte, half word or full word, and for a memory access of any size, for example byte, half word or full word. Once, the reference type, reference address and comparison criteria, both within a given word as shown by B and R in FIG. 8 and relative to a given word as shown at 37 in FIG. 4, have been selected, the registers 31, 37 (see FIG. 4), and 51 (see FIG. 6) can be loaded with the appropriate information to obtain the desired operation of decision logic 23 (see FIG. 3).

Although exemplary embodiments of the invention are described above in detail, this does not limit the scope of the invention, which can be practiced in a variety of embodiments.

What is claimed is:

1. A method of monitoring for a memory access, comprising:

selecting a portion of memory;

from among a plurality of available memory relationships, selecting a memory relationship relative to the selected portion of memory, wherein the selected memory relationship includes a comparative relationship between a most significant part of a bus address associated with the accessed portion of memory and a corresponding most significant part of a reference address associated with the selected portion of memory and said comparative relationship includes at least one of a plurality of possible constituent comparative relationships, said plurality of possible constituent comparative relationships including the most significant part of the bus address greater than the corresponding most significant part of the reference address, the most significant part of the bus address less than the corresponding most significant part of the reference address, and the most significant part of the bus address equal to the corresponding most significant part of the reference address; and detecting whether a portion of memory that is being accessed bears the selected memory relationship relative to the selected portion of memory.

2. A method of monitoring for a memory access, comprising:

selecting a portion of memory;

from among a plurality of available memory relationships, selecting a memory relationship relative to the selected portion of memory, wherein the selected memory relationship includes a comparative relationship between a most significant part of a bus address associated with the accessed portion of memory and a corresponding most significant part of a reference address associated with the selected portion of memory and the most significant part of the bus address is a word address portion of the bus address, and the most significant part of the reference address is a word address portion of the reference address; and detecting whether a portion of memory that is being accessed bears the selected memory relationship relative to the selected portion of memory.

3. A method of monitoring for a memory access, comprising:

selecting a portion of memory;

from among a plurality of available memory relationships, selecting a memory relationship relative to the selected portion of memory, wherein the selected memory relationship includes a comparative relationship between a most significant part of a bus address associated with the accessed portion of memory and a corresponding most significant part of a reference address associated with the selected portion of memory and the selected memory relationship includes a further comparative relationship between a least significant part of the bus address and a corresponding least significant part of the reference address; and detecting whether a portion of memory that is being accessed bears the selected memory relationship relative to the selected portion of memory.

4. The method of claim 3, wherein said further comparative relationship includes at least one of a plurality of possible constituent comparative relationships, said plurality of possible constituent comparative relationships including the least significant part of the bus address greater than the corresponding least significant part of the reference address, the least significant part of the bus address less than the corresponding least significant part of the reference address, and the least significant part of the bus address equal to the corresponding least significant part of the reference address.

5. The method of claim 4, including providing first size information indicative of a size of the selected portion of memory and second size information indicative of a size of the accessed portion of memory.

6. The method of claim 5, wherein said determining step includes producing, in response to the least significant part of the bus address and the second size information, first signals indicative of the size and location of the accessed portion of memory.

7. The method of claim 6, wherein said determining step further includes producing, based on said further comparative relationship and the least significant part of the reference address and the first size information, qualifier signals that respectively correspond to said first signals.

8. The method of claim 7, wherein said determining step includes combining the qualifier signals with the respectively corresponding first signals to determine when any given qualifier signal and its corresponding first signal are both active.

9. A method of monitoring for a memory access, comprising:

selecting a portion of memory;

from among a plurality of available memory relationships, selecting a memory relationship relative to the selected portion of memory, wherein the selected memory relationship includes a comparative relationship between a least significant part of a bus address associated with the accessed portion of memory and a corresponding least significant part of a reference address associated with the selected portion of memory; and detecting whether a portion of memory that is being accessed bears the selected memory relationship relative to the selected portion of memory.

10. The method of claim 9, wherein said comparative relationship includes at least one of a plurality of possible constituent comparative relationships, said plurality of possible constituent comparative relationships including the least significant part of the bus address greater than the corresponding least significant part of the reference address, the least significant part of the bus address less than the corresponding least significant part of the reference address, and the least significant part of the bus address equal to the corresponding least significant part of the reference address.

11. The method of claim 9, including providing first size information indicative of a size of the selected portion of memory and second size information indicative of a size of the accessed portion of memory.

12. The method of claim 11, wherein said determining step includes producing, in response to the least significant part of the bus address and the second size information, first signals indicative of the size and location of the accessed portion of memory.

13. The method of claim 12, wherein said determining step further includes producing, based on said comparative relationship and the least significant part of the reference address and the first size information, qualifier signals that respectively correspond to said first signals.

14. The method of claim 13, wherein said determining step includes combining the qualifier signals with the respectively corresponding first signals to determine when any given qualifier signal and its corresponding first signal are both active.

15. An apparatus for monitoring a memory access, comprising:
a first input for receiving first information indicative of a selected portion of memory and a memory relationship relative to the selected portion of memory, wherein said memory relationship is a selected one of a plurality of available memory relationships;
a second input for receiving second information indicative of a portion of memory that is being accessed; and
decision logic coupled to said first and second inputs and responsive to said first and second information for detecting whether said accessed portion of memory bears the selected memory relationship relative to said selected portion of memory.

16. The apparatus of claim 15, including a register coupled to said first input for providing thereto at least a portion of said first information.

17. The apparatus of claim 16, including a memory address bus coupled to said second input for providing said second information.

18. The apparatus of claim 15, including a memory address bus coupled to said second input for providing said second information.

19. The apparatus of claim 15, wherein said second information includes a bus address associated with said accessed portion of memory and size information indicative of a size of said accessed portion of memory, said decision logic including a byte enable generator coupled to said second input and responsive to said size information and a least significant part of said bus address for producing byte enable signals indicative of the size and location of said accessed portion of memory.

20. The apparatus of claim 19, wherein said first information includes qualifier signals that respectively correspond to said byte enable signals, said decision logic including a combiner coupled to said first input and said byte enable generator for comparing the qualifier signals with their corresponding byte enable signals to determine when any given qualifier signal and its corresponding byte enable signal are both active.

21. The apparatus of claim 15, wherein said first information includes a most significant part of a reference address associated with said selected portion of memory, said second information includes a most significant part of a bus address associated with said accessed portion of memory, and said decision logic includes compare logic for generating compare signals which respectively indicate when said most significant part of said bus address is greater than, less than, or equal to said most significant part of said reference address.

22. The apparatus of claim 21, wherein said first information includes enable signals which respectively correspond to said compare signals, said decision logic including gating logic coupled to said compare logic and said first input, said gating logic operable for detecting when one of said enable signals and its corresponding compare signal are both active.

23. The apparatus of claim 15, including a plurality of memory address buses coupled to said second input for providing said second information, said decision logic including a selector for selecting one of said memory address buses from which to receive said second information.

24. A system for monitoring a memory access within an integrated circuit, comprising:
a first input provided on the integrated circuit for receiving first information indicative of a selected portion of memory and a memory relationship relative to the selected portion of memory, wherein said memory relationship is a selected one of a plurality of available memory relationships;
a second input provided on the integrated circuit for receiving second information indicative of a portion of memory that is being accessed;
decision logic provided on the integrated circuit and coupled to said first and second inputs and responsive to said first and second information for detecting whether said accessed portion of memory bears the selected memory relationship relative to said selected portion of memory; and
a man/machine interface coupled to said first input for permitting a user to provide said first information to said first input.

25. The system of claim 24, wherein said man/machine interface includes a host computer and an emulation controller coupled between said host computer and said first input.

26. The system of claim 25, wherein said host computer is a PC.

27. The system of claim 24, wherein said man/machine interface includes one of a tactile interface and a visual interface.

28. The system of claim 24, wherein said second information includes a bus address associated with said accessed portion of memory and size information indicative of a size of said accessed portion of memory, said decision logic including a byte enable generator coupled to said second input and responsive to said size information and a least significant part of said bus address for producing byte enable signals indicative of the size and location of said accessed portion of memory.

29. The system of claim 28, wherein said first information includes qualifier signals that respectively correspond to said byte enable signals, said decision logic including a combiner coupled to said first input and said byte enable generator for comparing the qualifier signals with their corresponding byte enable signals to determine when any given qualifier signal and its corresponding byte enable signal are both active.

30. The system of claim 24, wherein said first information includes a most significant part of a reference address associated with said selected portion of memory, said second information includes a most significant part of a bus address associated with said accessed portion of memory, and said decision logic includes compare logic for generating compare signals which respectively indicate when said most significant part of said bus address is greater than, less than, or equal to said most significant part of said reference address.

31. The system of claim 30, wherein said first information includes enable signals which respectively correspond to said compare signals, said decision logic including gating logic coupled to said compare logic and said first input, said gating logic operable for detecting when one of said enable signals and its corresponding compare signal are both active.

32. The system of claim 24, including a plurality of memory address buses coupled to said second input for providing said second information, said decision logic including a selector for selecting one of said memory address buses from which to receive said second information.

33. The system of claim 24, including a register provided on the integrated circuit and coupled between said first input and said man/machine interface for providing at least a portion of said first information to said first input.

* * * * *